United States Patent
Shimizu et al.

(10) Patent No.: US 6,798,236 B2
(45) Date of Patent: Sep. 28, 2004

(54) OUTPUT BUFFER CIRCUIT WITH POWER SUPPLY VOLTAGES DIFFERENT FROM A POWER SUPPLY VOLTAGE APPLIED TO AN INTERNAL CIRCUIT

(75) Inventors: Tadayuki Shimizu, Tokyo (JP); Takafumi Takatsuka, Tokyo (JP); Masaki Tsukude, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 140 days.

(21) Appl. No.: 10/271,799

(22) Filed: Oct. 17, 2002

(65) Prior Publication Data

US 2003/0193084 A1 Oct. 16, 2003

(30) Foreign Application Priority Data

Apr. 12, 2002 (JP) ......................................... 2002-110784

(51) Int. Cl.[7] .......................... H03K 19/003; G11C 7/10
(52) U.S. Cl. .............................. 326/27; 326/26; 326/23; 326/24; 326/58; 365/189.05; 365/227; 365/225.7; 365/63
(58) Field of Search ............................... 326/26, 27, 22, 326/23, 24, 57, 58; 365/189.05, 226, 227, 63, 225.7

(56) References Cited

U.S. PATENT DOCUMENTS 5,825,707 A * 10/1998 Nozawa et al. ............. 365/226

6,674,304 B1 * 1/2004 Matthews ..................... 326/80

FOREIGN PATENT DOCUMENTS

| JP | 6-68679 | 3/1994 | ......... G11C/11/417 |
| JP | 6-164362 | 6/1994 | ....... H03K/19/0175 |

* cited by examiner

Primary Examiner—Andrew Q. Tran
(74) Attorney, Agent, or Firm—McDermott Will & Emery LLP

(57) ABSTRACT

A semiconductor integrated circuit which is supplied with a first power supply voltage and a second power supply voltage from outside so as to operate incorporated circuits, and outputs data at an output terminal, includes an internal circuit that carries out a predetermined function for an input signal, an output circuit which includes a first circuit for converting the signal from the internal circuit into an output signal and a second circuit containing a final stage buffer circuit which outputs, depending on the signal from the first circuit, data to the output terminal; and a switching circuit that switches a power supply voltage supplied to the second circuit, to either the first power supply voltage or the second power supply voltage. A voltage obtained by decreasing the first power supply voltage is supplied to the internal circuit. The first power supply voltage is supplied to the first circuit.

11 Claims, 8 Drawing Sheets

OUTPUT BUFFER CIRCUIT WITH POWER SUPPLY VOLTAGES DIFFERENT FROM A POWER SUPPLY VOLTAGE APPLIED TO AN INTERNAL CIRCUIT

BACKGROUND OF THE INVENTION

1. Field of the Invention

The present invention relates to a semiconductor integrated circuit, and in particular to a circuit having an input buffer, an internal circuit and an output buffer, in which a power supply voltage supplied to the internal circuit is different from power supply voltages supplied to the input and output buffers.

2. Related Art

In accordance with a recent tendency of low power consumption, a driving power supply voltage of semiconductor integrated circuit tends to be decreased. The tendency of a low driving power supply voltage has been gradually proceeding. Nowadays, various types of driving voltages exist. There has been provided a semiconductor integrated circuit capable of operating with a plurality types of power supply voltages including a high driving voltage and a low driving voltage.

FIG. 10 shows a structure of semiconductor integrated circuit which can correspond to two types of power supply voltages. As shown in FIG. 10, the semiconductor integrated circuit includes an internal circuit 15 for carrying out processing corresponding to predetermined functions of the semiconductor integrated circuit and an output circuit 10 for outputting data received from the internal circuit 15 to a subsequent circuit. A power supply voltage VDD1 is supplied to the internal circuit 15, and a power supply voltage VDD2 or VDD3 is supplied to the output circuit 10.

The voltage VDD2 supplied to the output circuit 10 is an external power supply voltage inputted via a power supply input terminal of the semiconductor integrated circuit and is, e.g., 3.0V. The voltage VDD1 supplied to the internal circuit 15 is a voltage (e.g., 2.5V) obtained by reducing the external power supply voltage VDD2. One of the power supply voltages VDD2 and VDD3 can be supplied to the output circuit 10. The power supply voltage VDD3 is a power supply voltage for input/output which is inputted via an input terminal of IO power supply of the semiconductor integrated circuit and is lower than the external power supply voltage VDD2. The power supply voltage VDD3 is for example, 1.8V.

The power supply voltages VDD2 and VDD3 supplied to the output circuit 10 are switched by a user depending on applications of the semiconductor integrated circuit at a time of its use. Switching of power supply can be performed by changing a connected point of a power supply pad within the semiconductor integrated circuit.

As described above, in a case of the semiconductor integrated circuit which switches, depending on applications, a power supply voltage to be supplied to the output circuit 10 to a high voltage VDD2 or a low voltage VDD3, circuits within the output circuit 10 are designed in accordance with high power supply voltage VDD2. Thus, there arises a problem in that when the output circuit 10 is driven with a supplied low power supply voltage VDD3, an access time would become slow.

SUMMARY OF THE INVENTION

The present invention is developed in order to solve the above drawback and an object of the present invention is to provide a semiconductor integrated circuit capable of suppressing a decrease in performance even if an output circuit is operated at a low voltage in the semiconductor integrated circuit that realizes low power consumption.

According to the invention, a semiconductor integrated circuit is provided, which is supplied with a first power supply voltage and a second power supply voltage from outside so as to operate incorporated circuits, and outputs data at an output terminal. The semiconductor integrated circuit includes: an internal circuit that carries out a predetermined function for an input signal; an output circuit which includes a first circuit for converting the signal from the internal circuit into an output signal and a second circuit containing a final stage buffer circuit which outputs, depending on the signal from the first circuit, data to the output terminal; and a switching circuit that switches a power supply voltage to be supplied to the second circuit, to either the first power supply voltage or the second power supply voltage. A voltage obtained by decreasing the first power supply voltage is supplied to the internal circuit. The first power supply voltage is supplied to the second circuit. Thus, by decreasing the power supply voltage to be supplied to the buffer circuit, while a decrease in performance of the output circuit is suppressed, low power consumption can be realized as a whole. Further, as the power supply for the buffer circuit in the output circuit can be switched by a switching circuit, the semiconductor integrated circuit which can correspond to a plurality types of IO power supplies can be provided.

The first power supply voltage may be higher than the second power supply voltage. Thus, a delay of access time of the output circuit due to a decrease in power supply voltage can be suppressed to a delay caused only by the buffer circuit. As a result, a decrease in performance can be suppressed while decreasing power consumption as a whole.

The voltage obtained by decreasing the first power supply voltage and supplied to the internal circuit may be higher than the second power supply voltage. Thus, high speed in the internal circuit can be accomplished.

The switching circuit may perform switching based on a switching signal generated in a semiconductor device which is molded together with the semiconductor integrated circuit. Thus, switching of power supply can be easily realized in the switching circuit.

The switching signal may be generated by electrically connecting an inner lead connected to a predetermined potential to a pad. Thus, the switching signal can be easily generated by using an inner lead connected to a predetermined potential.

The switching signal may be generated based on data recorded in a rewritable storage. Thus, the switching signal can be easily generated by rewriting data of storage such as a memory or the like.

The rewritable storage may be provided within another integrated circuit but is molded in the same package. Thus, the semiconductor integrated circuit can be provided with one chip.

The switching signal may be generated in accordance with electrical disconnection of a fuse. Thus the switching signal can be easily generated by using a fuse.

The semiconductor integrated circuit may further inluclude a mode selection circuit that outputs, as the switching signal, a test signal input from outside when receiving a test mode signal. Thus, the power supply can be switched without utilizing the switching signal generated by using the inner lead or the storage, and an operational test of the circuit can be performed.

In the semiconductor integrated circuit, a configuration of a buffer circuit at the final stage may be varied depending on the switching signal. Thus, a buffer circuit which is suitable for the supplied power supply can be used in the output circuit, and an operation under more appropriate conditions is possible.

In the output circuit, a size of transistor in a buffer circuit at the final stage may be varied depending on the switching signal. Thus, a buffer circuit with a transistor size suitable for the supplied power supply can be used in the output circuit, and the operation under more appropriate conditions is possible.

The second circuit may include only a buffer circuit at the final stage. Thus, the semiconductor integrated circuit is more appropriate to accomplish high speed and low power consumption at the same time.

DESCRIPTION OF THE PREFERRED EMBODIMENTS

Hereinafter, embodiments of a semiconductor integrated circuit according to the present invention will be described in detail with reference to the attached drawings.
First Embodiment.

Figure 1:
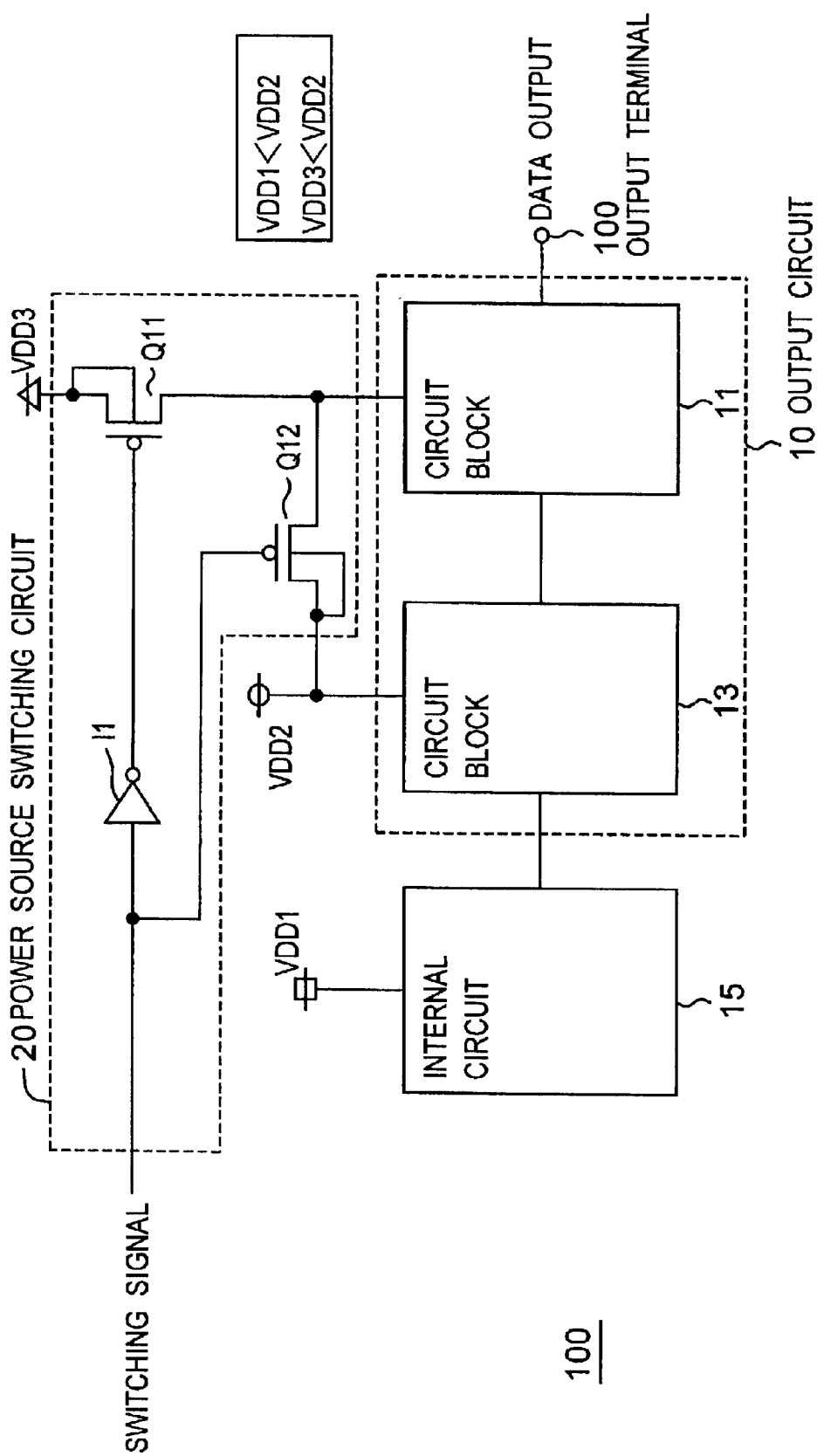
FIG. 1 is a structural view of semiconductor integrated circuit according to a first embodiment of the present invention.

FIG. 1 shows a configuraiton of semiconductor integrated circuit according to the present invention. The semiconductor integrated circuit 100 includes an internal circuit 15 which carries out a predetermined function, an output circuit 10 which drives an output signal for a subsequent circuit, and a power supply switching circuit 20 which switches a power supply for the output circuit 10. A level shift circuit (not shown) is interposed between the internal circuit 15 and the output circuit 10. The level shift circuit shifts a level of an output signal from the internal circuit 15 into a high level corresponding to an input stage of the output circuit 10.

The output circuit 10 of this embodiment is divided into two circuit blocks, that is, a circuit 13 serving as a circuit block at the side of the internal circuit that converts a signal from the internal circuit 15 into an output signal, and a circuit 11 serving as a circuit block that outputs data to an output terminal 100 depending on the signal from the circuit 13.

To the semiconductor integrated circuit in this embodiment, for example, 3.0V of power supply voltage (which hereinafter is referred to as "external power supply voltage") VDD2 is supplied from the external power supply terminal. Further, for example, 1.8V of power supply voltage (which hereinafter is referred to as "IO power supply voltage") VDD3 is supplied from the IO power supply terminal as a power supply for input/output circuit. A voltage VDD1 (e.g., 2.5V) obtained by reducing the external power supply VDD2 is connected to the internal circuit 15. The external power supply voltage VDD2 is supplied to the circuit 13 at the side of the internal circuit in the output circuit 10. The external power supply voltage VDD2 or the IO power supply voltage VDD 3 which is lower than the external power supply voltage VDD2 is supplied to the circuit 11 at the side of the output terminal. The power supply voltage connected to the circuit 11 is switched, depending on applications, by a power supply switching circuit 20 to the power supply voltage VDD2 or VDD 3. The power supply voltage VDD3 may be generated by reducing the external power supply voltage VDD2. The following relationships are provided for the respective power supply voltages.

VDD1<VDD2

VDD3<VDD2

It is noted that the power supply voltage VDD1 which is supplied to the internal circuit 15 is preferably higher than the IO power supply voltage VDD3 in order to realize high speed processing.

The power supply switching circuit 20 includes an inverter 11 and PMOS transistors Q11 and Q12, and switches, in accordance with a switching signal, the power supply voltage to be supplied to the circuit 11 within the output circuit 10 to the external power supply voltage VDD2 or the power supply voltage VDD3. Namely, when the switching signal is "H (High)", the power supply VDD3 is selected as the power supply for the circuit 11. When the switching signal is "L (Low)", the power supply VDD2 is selected as the power supply for the circuit 11 (see FIG. 2). In this way, the power supply voltages VDD2 or VDD3 is selectively used as the output power supply.

Figure 2:
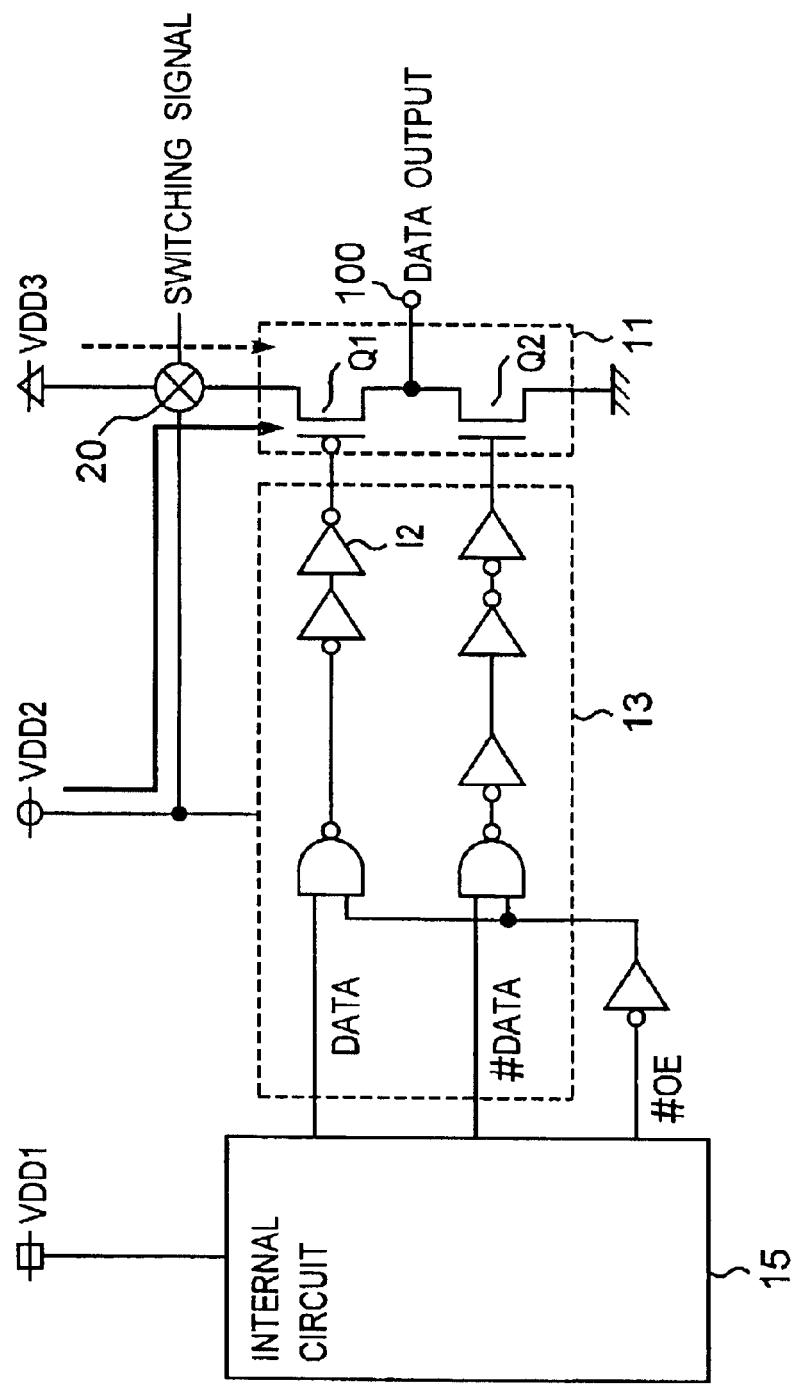
FIG. 2 is a view showing a specific structural example of an output circuit of the semiconductor integrated circuit.

As shown in FIG. 2, the circuit 13 on the side of the internal circuit 15 is a combination circuit including NAND gates and inverters. The circuit 13 generates a signal for transmitting the output signal from the internal circuit 15 to the subsequent circuit.

The circuit 11 on the side of the output end is a circuit block at the final stage in the output circuit 10, and includes at least an output buffer having a series circuit of a PMOS transistor Q1 and an NMOS transistor Q2. Preferably, the circuit 11 includes an inverter 12 which is connected to a gate of the PMOS transistor Q1. Thus, for example, even if power supply supply to circuits other than the circuit 11 of the semiconductor integrated circuit is interrupted for low power consumption, the inverter 12 can prevent the PMOS transistor Q1 from being turned on. Consequently, it is possible to prevent conduct of current in the PMOS transistor Q1, and even low power consumption can be realized.

As described above, in accordance with the semiconductor integrated circuit of the first embodiment, the external power supply voltage is supplied to the circuit 13 at the side of the internal circuit in the output circuit 10. Further, the external power supply voltage VDD2 or the power supply voltage VDD3 which is lower than VDD2 is selectively supplied to the circuit 11. The lower voltage VDD3 is supplied to the circuit 11 which is at the final stage in the output circuit and has minimum circuit structure. Thus, a delay of access time due to a decrease in the power supply voltage can be minimized, and low power consumption can be achieved. Moreover, the semiconductor integrated circuit can operate with two types of output power supplies. In the circuit 11, a size of transistor is large and a gate width of the transistor Q1 is hundreds microns, which is about ten or more times larger than that of the circuit 13. A large amount of currents flow through the circuit 11, and thus a supply voltage must be reduced at least for the circuit 11.

As described above, the power supply voltage is supplied to the circuit portion other than the final stage circuit portion in the output circuit 10, and lower voltage which is obtained by decreasing the power supply voltage is supplied to the final stage circuit portion. Thus, a delay of access time can be minimized. That is to say, while a decrease in performance can be suppressed, power consumption of the whole semiconductor integrated circuit can be reduced.

In accordance with the semiconductor integrated circuit of the first embodiment, the power supply to the circuit 11 on the output end side can be easily switched in response to a switching signal. Examples of the switching signal generating circuit which generates the switching signal are described below. Each of the switching signal generating circuits described hereinafter may be basically provided within the semiconductor integrated circuit of the present invention. Alternatively, the switching signal generating circuit may be provided outside the semiconductor integrated circuit. In that case, the switching signal generating circuit is preferably molded together with the semiconductor integrated circuit and stored within the same package.

(First Example of Switching Signal Generating Circuit)

Figure 3:
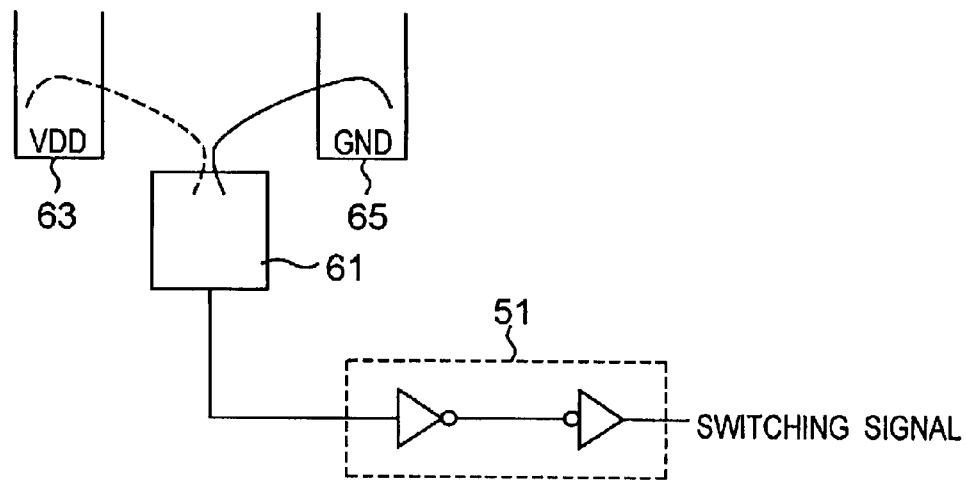
FIG. 3 is a view showing an example of switching signal generating circuit using an inner lead connected to a pad.

FIG. 3 shows an example of generating a switching signal by a bonding option. A switching control circuit 51 includes two inverters and an input thereof is connected to a pad 61. To generate a switching signal of "H", the pad 61 is connected to an inner lead 63 which is connected to the power supply (VDD). On the other hand, to generate a switching signal of "L", the pad 61 is connected to an inner lead 65 which is connected to a ground (GND). When the switching signal is "H", a power supply is supplied from the power supply VDD3 to the output circuit 11 as shown by a broken line arrow in FIG. 2. When the switching signal is "L", a power supply is supplied from the power supply VDD2 to the output circuit 11 as shown by a solid line arrow in FIG. 2. As described above, the power supply to the output circuit 11 can be switched by the bonding option.

(Second Example of Switching Signal Generating Circuit)

Figure 4:
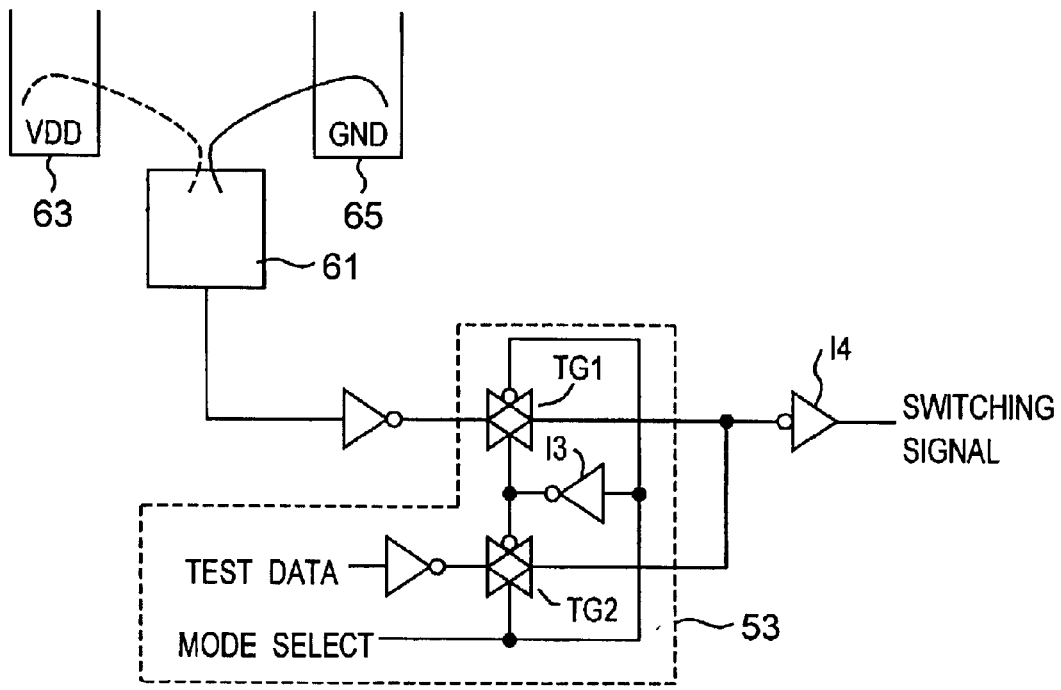
FIG. 4 is a view showing an example of the switching signal generating circuit using an inner lead connected to a pad, which can perform a test operation.

FIG. 4 shows a circuit configuration in which a test of switching signal is possible in the circuit shown in FIG. 3. The configuration shown in FIG. 4 is provided with a mode selection circuit 53. The mode selection circuit 53 includes two transfer gates TG1 and TG2 and inverters. Through the inverter 13, complementary signals depending on a mode select signal are respectively fed to the transfer gates TG1 and TG2. The mode selection circuit 53A is inputted with mode select signal for setting a test mode and test data.

In a test mode, the mode select signal becomes active (i.e., "H"). At this time, the transfer gate TG2 is turned on to transmit the test data, as a switching signal, to the inverter I4. The transfer gate TG1 is switched off, and does not transmit a signal from the pad 61 to the inverter I4.

On the other hand, in a non-test mode, the mode select signal becomes non-active (i.e., "L"). At this time, the transfer gate TG1 turns on to transmit the signal from the pad 61, as a switching signal, to the inverter I4. The transfer gate TG2 is switched off to prevent the test data from being transmitted to the inverter I4.

According to such the circuit configuration, two types of power supplies for the output circuit 11 can be tested prior to wiring between the inner lead and the pad.

(Third Example of Switching Signal Generating Circuit)

Figure 5A:
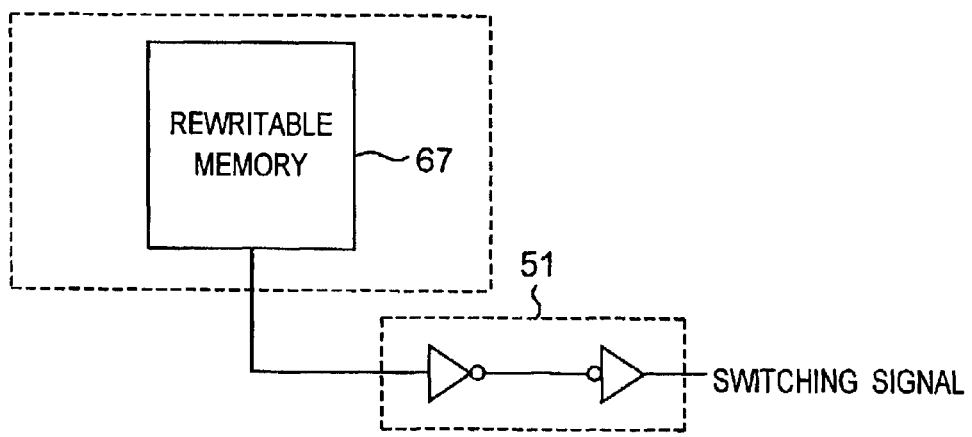
FIG. 5A is a view showing an example of the switching signal generating circuit using a memory circuit.
Figure 5B:
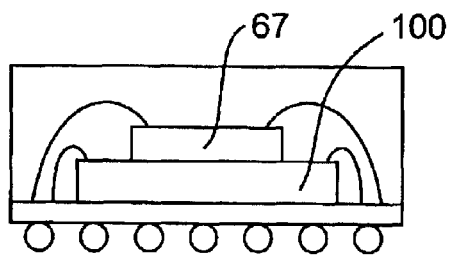
FIG. 5B is a view showing MCP storing the memory circuit and the semiconductor integrated circuit.

FIG. 5A shows a configuration for utilizing data stored in a memory circuit as a switching signal. A memory circuit 67 is a rewritable memory, and has a predetermined storage area for recording data providing the switching signal. The switching control circuit 51 is connected to, e.g., a data line of the memory circuit 67 such that a read out signal is obtained from the predetermined storage area storing the switching signal data. By rewriting the recorded data in the memory circuit 67, a switching signal value can be varied optionally. The memory circuit may be provided on the same chip as the semiconductor integrated circuit. Alternatively, a memory circuit provided outside may be utilized. At that case, the memory circuit 67 is preferably molded together with the semiconductor integrated circuit 100 to be integrated within the same package, as shown in FIG. 5B.

Figure 6:
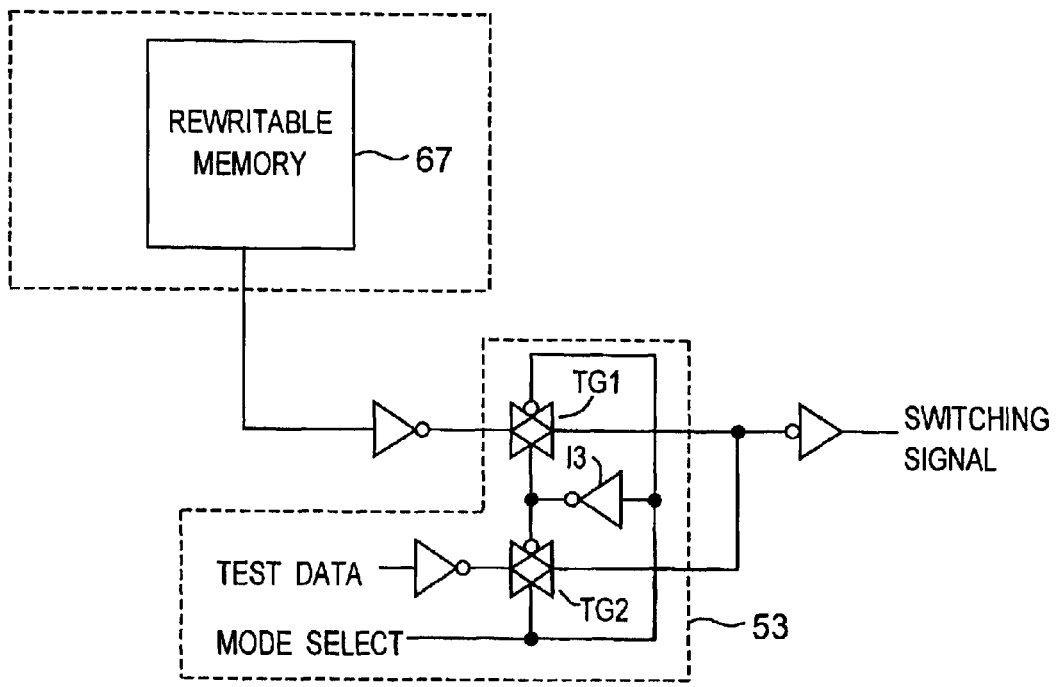
FIG. 6 is a view showing an example of the switching signal generating circuit using a memory circuit, which can perform the test operation.

In accordance with a circuit structure shown in FIG. 6, the mode selection circuit 53 is added to the circuit structure shown in FIG. 5A. According to such the circuit structure, two types of power supplies for the output circuit 11 can be tested without writing the data into the memory circuit.

(Fourth Example of Switching Signal Generating Circuit)

Figure 7:
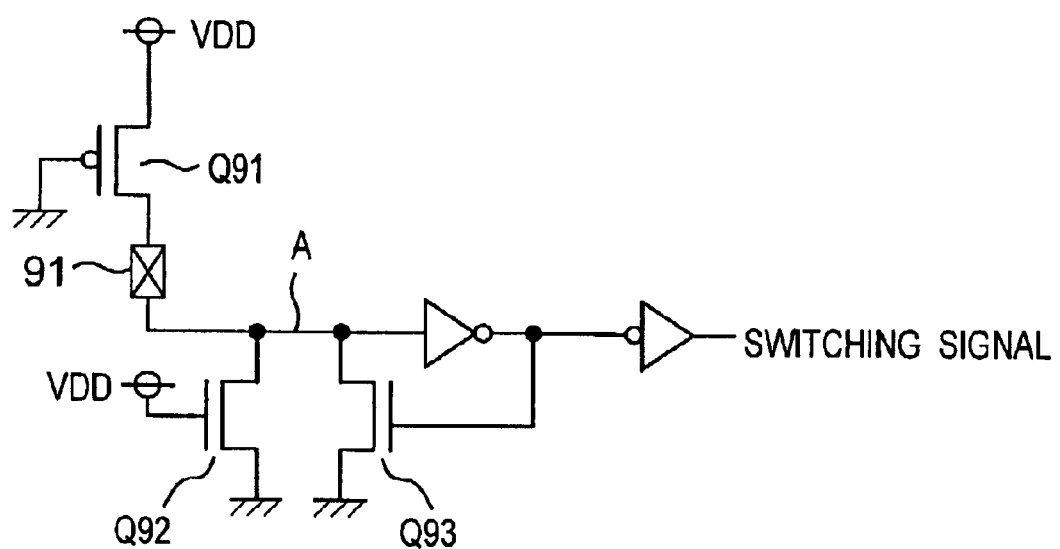
FIG. 7 is a view showing an example of the switching signal generating circuit using a fuse.

FIG. 7 shows a circuit configuration for generating a switching signal by using a fuse. A circuit shown in FIG. 7 includes a PMOS transistor Q91, a fuse 91, NMOS transistors Q92 and Q93, and two inverters. The power supply VDD, the PMOS transistor Q91, the fuse 91 and two inverters are serially connected. The parallel connected NMOS transistors Q92 and Q93 are interposed between a ground and a node between the fuse 91 and the preceding inverter.

To output "H" as a switching signal, the fuse 91 is rendered conductive. Thus, a node A becomes "H" to generate the switching signal of "H". To output "L" as the switching signal, the fuse 91 is disconnected so as not to be conductive. Thus, the node A becomes "L" to generate the switching signal of "L".

Figure 8:
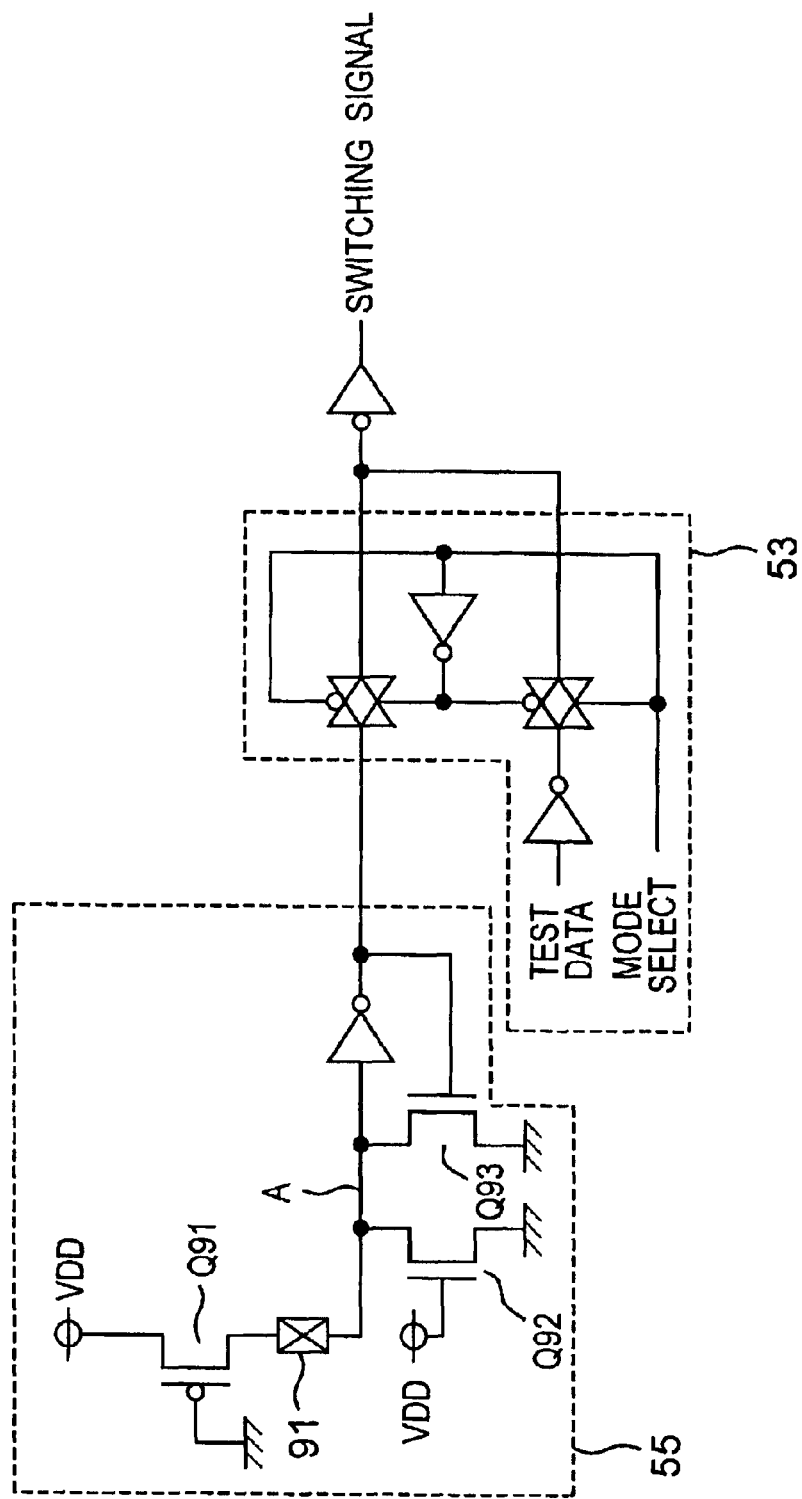
FIG. 8 is a view showing an example of the switching signal generating circuit using a fuse, which can perform the test operation.
Figure 9:
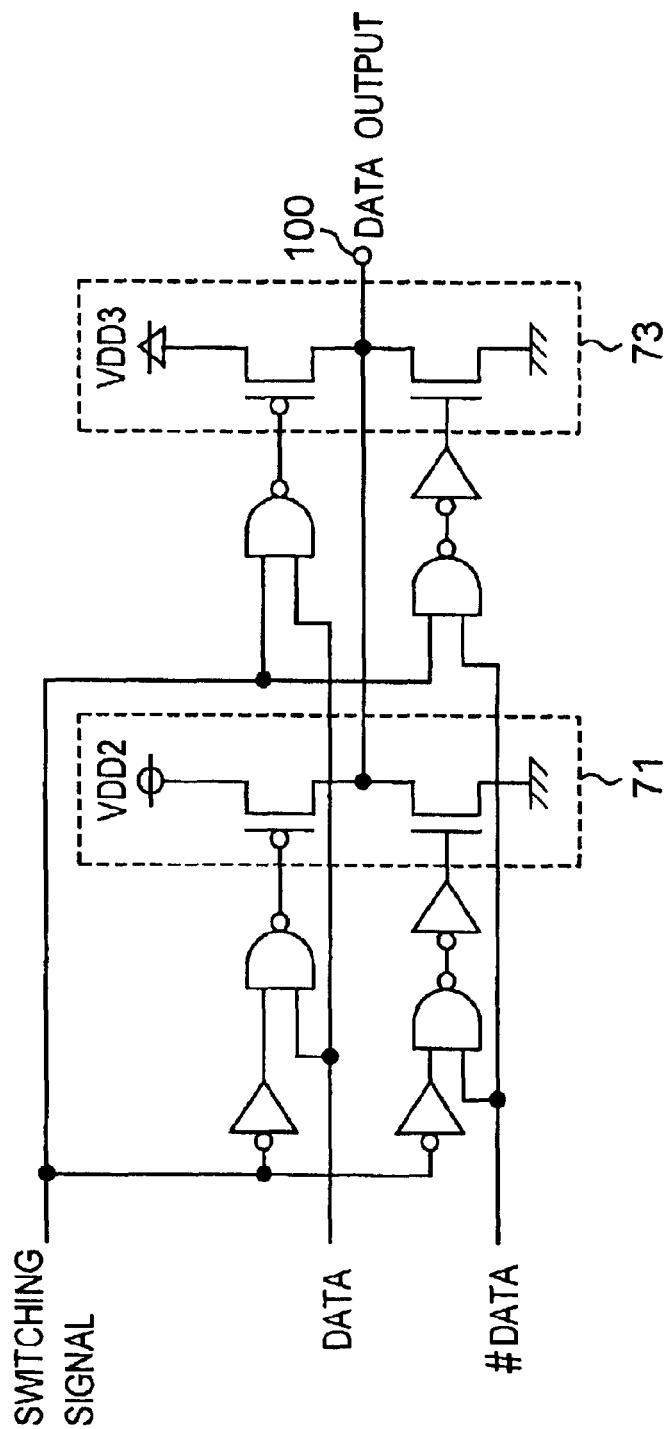
FIG. 9 is a structural view of semiconductor integrated circuit (output circuit) according to a second embodiment of the present invention.
Figure 10:
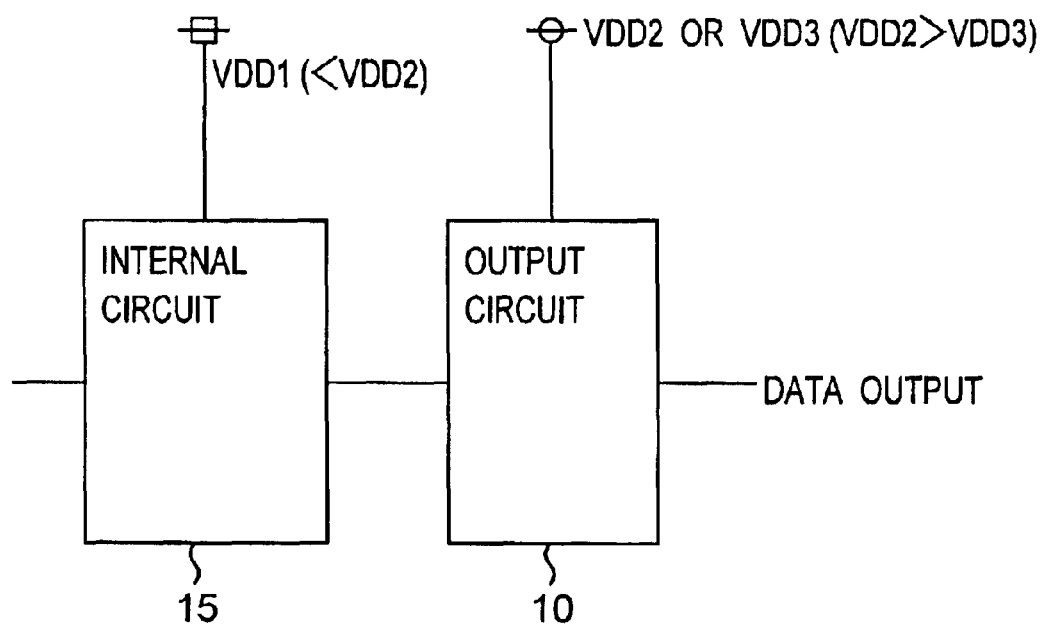
FIG. 10 is a structural view of conventional semiconductor integrated circuit.

In accordance with a circuit configuration shown in FIG. 8, the mode selection circuit 53 is added to the circuit shown in FIG. 7. According to such the circuit configuration, two types of power supplies for the output circuit 11 can be tested without disconnecting the fuse 91.

Second Embodiment.

In this embodiment, two output buffers having different power supply voltages are provided at the circuit 11 at the side of the output end in the above-described output circuit 10. Namely, provided are a first output buffer 71 to which a voltage is supplied from the power supply VDD2, and a second output buffer 73 to which a voltage is supplied from the power supply VDD3. Each output buffer 71 or 73 includes a series circuit of PMOS transistor and NMOS transistor. One of these two output buffers 71 and 73 is selected by the above-described switching signal. That is to say, when the switching signal is "L", the first output buffer 71 is selected. On the other hand, when the switching signal is "H", the second output buffer 73 is selected.

As described above, a plurality of output buffers with different power supply voltages are provided, in which one of the output buffers is selected by the switching signal to be used. Thus, an output buffer which is designed optimally in accordance with an output voltage can be selected. As a result, the operation under more appropriate conditions can be achieved, resulting in more reduction of access time. In the above embodiments, higher voltage is supplied to the circuit other than the circuit 11 at the final stage in the output circuit 10, i.e., the preceding circuit 12. However, depending on the access time required in the market, lower voltage may be supplied to whole or a part of the preceding circuit 12 in addition to the final stage circuit 11.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present disclosure relates to subject matter contained in Japanese Patent Application Nos. 2002-110784 and 2002-110786, filed on Apr. 12, 2002, which are expressly incorporated herein by reference in its entirety.

What is claimed is:

1. A semiconductor integrated circuit which is supplied with a first power supply voltage and a second power supply voltage from outside so as to operate incorporated circuits, and outputs data at an output terminal, comprising:

an internal circuit that carries out a predetermined function for an input signal;

an output circuit which includes a first circuit for converting the signal from the internal circuit into an output signal and a second circuit containing a final stage buffer circuit which outputs, depending on the signal from the first circuit, data to the output terminal; and a switching circuit that switches a power supply voltage to be supplied to the second circuit, to either the first power supply voltage or the second power supply voltage, wherein a voltage obtained by decreasing the first power supply voltage is supplied to the internal circuit, and the first power supply voltage is supplied to the first circuit.

2. The semiconductor integrated circuit according to claim 1, wherein the first power supply voltage is higher than the second power supply voltage.

3. The semiconductor integrated circuit according to claim 1, wherein the voltage obtained by decreasing the first power supply voltage and supplied to the internal circuit is higher than the second power supply voltage.

4. The semiconductor integrated circuit according to claim 1, wherein the switching circuit performs switching based on a switching signal generated in a semiconductor device which is molded together with the semiconductor integrated circuit.

5. The semiconductor integrated circuit according to claim 4, wherein the switching signal is generated by electrically connecting an inner lead connected to a predetermined potential to a pad.

6. The semiconductor integrated circuit according to claim 4, wherein the switching signal is generated based on data recorded in a rewritable storage.

7. The semiconductor integrated circuit according to claim 6, wherein the rewritable storage is provided within another integrated circuit but is molded in the same package.

8. The semiconductor integrated circuit according to claim 4, wherein the switching signal is generated in accordance with electrical disconnection of a fuse.

9. The semiconductor integrated circuit according to claim 4, wherein in the output circuit, a configuration of a buffer circuit at the final stage is varied depending on the switching signal.

10. The semiconductor integrated circuit according to claim 4, wherein in the output circuit, a size of transistor in a buffer circuit at the final stage is varied depending on the switching signal.

11. The semiconductor integrated circuit according to claim 1, wherein the second circuit includes only a buffer circuit at the final stage.

* * * * *